United States Patent [19]

Benmalek et al.

[11] Patent Number: 5,830,579
[45] Date of Patent: Nov. 3, 1998

[54] STRIP BASED ON COATED ALUMINUM, WHICH IS RESISTANT TO CORROSION AND IS DEFORMABLE

[75] Inventors: Mohamed Benmalek, Saint-Martin d'Heres; Francis Allegret, Goncelin, both of France

[73] Assignee: Societe Anonyme de Traitment des Metaux et Alliages Company (SATMA), Goncelin, France

[21] Appl. No.: 669,306

[22] PCT Filed: Jan. 4, 1995

[86] PCT No.: PCT/FR95/00005

§ 371 Date: Jul. 3, 1996

§ 102(e) Date: Jul. 3, 1996

[87] PCT Pub. No.: WO95/18878

PCT Pub. Date: Jul. 13, 1995

[30] Foreign Application Priority Data

Jan. 7, 1994 [FR] France .................................. 94 00293

[51] Int. Cl.$^6$ .............................. C23C 14/00; C23C 16/40
[52] U.S. Cl. .......................... 428/450; 427/567; 427/527; 427/588; 427/248.1; 204/192.23
[58] Field of Search ............................. 428/450; 427/567, 427/527, 568, 248.1; 204/192.23

[56] References Cited

U.S. PATENT DOCUMENTS

| 4,568,614 | 2/1986 | Eichen | 428/450 |
| 5,047,131 | 9/1991 | Wolfe | 204/192.23 |
| 5,508,368 | 4/1996 | Knapp | 427/534 |
| 5,523,124 | 6/1996 | Slootman | 427/534 |

*Primary Examiner*—Sam Silverberg
*Attorney, Agent, or Firm*—Oblon, Spivak, McClelland, Maier & Neustadt, P.C.

[57] ABSTRACT

A shiny or decorative aluminum or aluminum alloy based strip coated with an improved corrosion-resistant protective coating for preserving the surface appearance of the strip and providing port-forming protection thereof, wherein said coating consists of a layer of silicon oxide.

13 Claims, No Drawings

STRIP BASED ON COATED ALUMINUM, WHICH IS RESISTANT TO CORROSION AND IS DEFORMABLE

TECHNICAL DOMAIN

The invention relates to strips generally for reflecting or decorative use, which are based on aluminum or its alloys, which are coated with a deposit for protection against corrosion, and which are capable of being worked by shaping without alteration of the protection.

STATE OF THE ART

It is known that reflecting Al strips used, for example, as reflectors in the field of lighting, as a mirror, or as a decorative article requiring a high degree of brightness, need to keep their bright appearance during the course of use. This brightness can be dulled because of corrosion by the surrounding atmosphere, by the deposition of fine dust, scratches, fingerprints, etc. . . .

One way of protecting this brightness consists of coating the bright surface with a transparent coating that is resistant to corrosion, to scratching . . . ; this coating should alter the initial brightness as little as possible.

Thus, in order to obtain smooth reflecting strips, a conventional process consists of performing, on a very bright rolled Al alloy strip, an electrochemical pickling operation, then an electrochemical brightening treatment before electrochemical anodic oxidation, with the intention of obtaining a protective alumina film. A strip protected in this way can then be shaped, for example, by deformation, bending, embossing, cutting . . . , in order to manufacture the desired articles, such as reflectors for lighting or heating apparatuses, mirrors, bright pieces with a decorative effect (packaging of luxury cosmetic products, finishing articles for automobiles . . . ).

This process of electrochemical brightening and anode oxidation, or anode oxidation alone, is also applied to Al strips that have a different surface appearance (dull, for example) in order to improve its rendering and its protection.

However, in order to obtain smooth bright strips, such a solution has several disadvantages:

- it is necessary to use top-of-the-line Al alloys, typically alloys that are at least of the 1085 type (in the classification of the Aluminum Association), which alone can be brightened electrochemically;
- the shaping capability, which represents the capability of the strip coated with its protective alumina deposit to be shaped by deformation without the alteration of said deposit, is insufficient; in effect, when one wishes to do a folding or embossing operation with or without elongation or thinning, cracking of the alumina coating occurs, which alters the brightness and the resistance to corrosion of the coated strip.
- the anode oxidation operation alters the brightness obtained previously in the electrochemical brightening operation.
- the different electrochemical operations performed are a source of effluents, which are damaging to the environment and must be treated before being discarded.

Thus, the applicant has sought to develop a strip based on aluminum, which has a particular surface appearance previously obtained by rolling, for example, which is coated [for protection] against corrosion, which is economical, lending itself easily to shaping, for example, by bending, embossing, and with the resulting elongation, without altering its protection and its initial surface appearance.

She also sought to improve the brightness or the reflecting quality of the coated sheets, as well as their resistance in a corrosive atmosphere.

She also sought to obtain a coated strip that was not very sensitive to the deposition of dust or other dirt, such as fingerprints, which can occur during handling operations, and also which is not very sensitive to scratching.

She also sought to obtain articles with a particular surface appearance, reflecting or not (in particular, reflectors or decorative articles) directly by the mechanical working of a coated strip, for example, by embossing, bending . . . , keeping the appearance of the initial noncoated strip and the quality of the provided protection over time.

DESCRIPTION OF THE INVENTION

The invention is a strip based on aluminum or its alloys, coated with an anticorrosion protective substance, with said strip having an improved shaping capability allowing one to keep its surface appearance and anticorrosion protection intact after shaping, which is characterized by the fact that the coating consists of a layer of silicon oxide.

The invention is particularly applied to strips based on aluminum or its alloys, which has an initial surface appearance, decorative or not, obtained by rolling or another physical treatment. This surface appearance is advantageously of the bright, smooth, and/or reflecting type, for a mirror, reflector, or for decorative use, but it also includes the decorative appearances of the aluminum-based strips such as the granite-like, beaten, dull, fir-like, brushed, stone-like, or rough type after rolling (better known under the Anglo-Saxon term of mill finish), etc. . . . , also for decorative use, for example.

The strips according to the invention can be used to obtain all types of articles, using conventional shaping operations, including those causing extensive deformations, such as embossing or bending, and leading to extensive elongations of the strip.

Thus, the bending angles can, for example, reach 180° with very small radii of curvature without the appearance of cracking of the silicon oxide film and more generally without alteration of the quality of the protection provided; the radii of curvature of the bending angles and more generally the levels of deformation are only limited by the damage done to the strip itself.

In order to absorb these deformations while maintaining the initial appearance or reflecting power of the strip before coating, it is advantageous for the thickness of the silicon oxide layer to be between 0.1 and 1.5 $\mu$m.

If the thickness is too small, the protective silicon oxide film is less resistant to aggressions (for example, scratching) and presents risks of irisation; likewise, the irregularities of the surface of the metal are less well covered and can be the start of deterioration. In contrast, if the thickness is too great, there are risks of fissuration of the film when the strip is shaped, which would be contrary to the desired aim.

The silicon oxide film can be silica, but it is highly preferable to use a substoichiometric oxide of the $SiO_x$ type, with x being at least equal to 1.8 and less than 2, preferably 1.9 at the most; by preventing rigidity of the silica, a value of x of less than 2 allows one to obtain maximum flexibility of the film so that it supports the deformations of the strip with no damage occurring during its shaping, whereas a value of x of less than 1.7 leads to serious risks of coloring and consequently a loss of reflectance.

The layer can be applied on strips of Al alloys of all types, provided that after rolling, they have the desired surface quality, for example, of the reflecting type. It is therefore very advantageous to use inexpensive alloys, the choice of which is only limited by their ability to give the desired surface appearance by rolling and/or other previous physical treatment, with the other characteristics corresponding to the use under consideration.

"Inexpensive alloy" is understood to means alloys of the ordinary type, that is to say bottom-of-the-line, the simplest ones of which can be of low purity (for example, [type] 1050) and/or rough ones obtained from cold rolling.

Thus, in order to obtain—for example, by embossing, bending, or any other type of shaping—reflectors intended for lighting or heating apparatuses, from the strips of the invention, it is possible to use alloys with a purity less than that of alloy 1085, whereas for using the protection processes of prior art, this quality [purity requirement] is necessary. A fortiori, the invention can of course be applied to alloys of greater purity, among others, those of the 1199, which have a particular quality of brightness.

Likewise, for decorative articles, for example, for use in the automobile or packaging field, it is possible to use alloys of the ordinary type provided that one has the desired surface appearance, as has already been said.

It should be noted that for reflecting applications, one obtains articles of better quality by directly shaping the coated strips according to the invention, rather than articles obtained by coating a preshaped substrate (made of plastic, for example) having an intermediate layer for adherence, a deposit of Al for ensuring the brightness, and finally having a protective silica deposit. The shaping of a strip according to the invention is in effect simpler to carry out since it only uses a single deposit on a flat surface; it also allows one to obtain a better brightness than that obtained by the sequence of deposits on the preshaped substrate, and finally, the articles are of better quality due to the fact that one observes none of the harmful effects due to heterogeneity of the deposits appearing as soon as the form of said substrate becomes slightly complex.

The invention can also be applied to strips based on Al, of which one of the surfaces is coated with a polymer material, after or preferably before deformation; the reference surface is of course coated only with the layer of silicon oxide and is opposite the surface coated with polymer material.

Although the process can be applied to strips in a very broad thickness range, for the most common applications, the strip according to the invention has a thickness that is typically greater than 0.2 mm; it generally does not exceed 1.2 mm.

The strip according to the invention is therefore obtained by the direct deposition of a film of silicon oxide generally on one surface of a bare strip, previously rolled by ordinary techniques. However, according to the invention, it is possible to form a deposit of silicon oxide on both surfaces of the strip.

One preferably uses a deposition process in the vapor phase, with the rolled bare strip advantageously being pickled beforehand in order to improve the adherence of said deposit.

In a general manner, the pickling can be done:

chemically using basic solutions (for example, based on soda) or acidic solutions (mixture of acids), or electrolytically;

thermally, in order to eliminate the organic residues; the heating is preferably done at a temperature greater than 250° C. in order to be sufficiently effective. Such heating, which can modify the mechanical properties of the metal, may not be recommended in certain cases;

by heating under vacuum, which allows one to avoid the use of excessive temperature;

However, it is advantageously done by ionic pickling; with this technique, one generally obtains complete desorption of the carbon-containing residues under vacuum, with partial elimination of the surface oxide layer ($Al_2O_3$) without coming as far as the metal. This allows one to eliminate the surface impurities contained in said oxide layer, to reduce the roughness of said layer, and therefore to improve the reflectance of the strip, and to leave an active decontaminated surface that improves the adherence of the later silicon oxide deposit. This pickling is not done at the expense of the metal of the strip to be coated, as is the case in electrochemical pickling and brightening of the prior art, in which the metal is often attacked and in which one moreover generates sludge, which is detrimental to the environment and which must be treated before being discarded, increasing the cost of the process.

Thus, ionic pickling can improve the reflectance of the initial strip up to nearly 20% and can also reduce the microroughness of its surface oxide layer.

In the case of ionic pickling, the Al strip can be treated as it passes by in an argon vacuum chamber (generally a pressure of general less than 10 Pa). It is brought to a negative potential so as to create an electrical field, which allows for the pickling bombardment with argon ions. The pickling can be improved by the use of a radio-frequency (RF) electrical field. The power must be such that said bombardment does not deteriorate the surface (etching, grain detachment, breaking up, heating detrimental to its characteristics . . . ). The power is generally 1–50 mW/mm$^2$.

In order to obtain the actual protective film, one forms the silicon oxide deposit as it passes by in a PVD (Physical Vapor Deposition) process.

Several techniques can be used:

thermal evaporation by the Joule effect or induction evaporation by electron bombardment preferably cathode sputtering assisted by the magnetron effect in the radio-frequency (RF) mode or with direct current (dc) depending on whether the source material is respectively an electrical insulator or conductor ionic deposition.

As the source product to be deposited, it is possible to use at least one of the products, such as silicon or silicon oxide of the $SiO_x$ type, with x being less than 2. According to the stoichiometry of the source material, it may be recommended to perform the deposition in a reactive atmosphere containing oxygen, in order to obtain the desired stoichiometry in the oxide deposit.

In the case of cathode sputtering, assisted by the magnetron effect in the RF mode, which proves to be well suited for controlling the deposition, a target, for example, silicon oxide, is bombarded under a very low pressure (generally less than 10 Pa) by a plasma consisting of accelerated argon ions; the atoms of the target thus sputtered will form a film on the strip located facing said target. This deposition process is advantageously coupled with the ionic pickling mentioned above. The power used generally depends on the installation used.

It is possible to have the strip coated with the oxide deposit undergo annealing in order to improve the adherence and to increase the shaping capability of the metal. Annealing can also be obtained during ionic pickling by wisely controlling this operation; this will have the effect both of improving the adherence of the later oxide deposit and the forming capability of the metal (as in the preceding).

One notes that these deposition processes of the PVD type do not generate any chemical effluent.

As a variant, it is also possible to increase the brightness of the bare starting strip by performing the chemical and/or electrochemical pickling and brightening operations described in the preceding, before the deposition of silicon oxide.

Likewise, the plates were coated with an $SiO_2$ deposit using an $SiO_2$ target.

For the sake of comparison, the same tests were performed on a flat and bent sample, previously coated by an ordinary process of the prior art, that is to say, samples obtained from a very bright rolled top-of-the-line sheet metal of the 1098 type, which was then pickled, brightened, and subjected to anode oxidation, all in different electrolytic baths, in order to obtain a protective alumina film.

The results are given in the following Table I:

TABLE I

| Sample No. | Reflectance after treatment, % | Thickness of the deposit, $\mu$m | Scratching | Saline mist (200 h) | | |
| --- | --- | --- | --- | --- | --- | --- |
| | | | | Flat surface | Bent to 90° | Bent to 180° |
| Invention (1050 alloy) | | SiOx x = 1.8 | | | | |
| 1 | 87 | 0.67 | HB | ++++ | ++++ | +++ |
| 2 | 85 | 1.5 x = 2 | H | ++++ | ++++ | +++ |
| 4 | 85 | 1.4 | HB | +++ | ++ | ++ |
| Prior Art (1098 alloy) | | $Al_2O_3$ | | + (opaque) | + (opaque +) | + (opaque +) |
| 3 | 89 | 2.5 $\mu$m | F | | pitting) | pitting |

In order to illustrate the invention, the following tests were done using the Alcatel SCM 600 installation provided with a cathode having a diameter of 200 mm.

Bright rolled plates of inexpensive Al alloy of the 1050 type (according to the standards of the Aluminum Association) that were 0.5 mm thick, and with a surface area of approximately 100 cm², were taken.

They were pickled by ionic bombardment under the following conditions:

Total RF power: 700 W

Distance between target made of source material and surface to be coated: 70 mm

Pressure of the enclosure under vacuum: 1.5 Pa (0.015 mbar)

Flow rate of inert gas (Ar): 70 standard cm³/min

Duration: 2 min

A deposition from a target of $SiO_x$ (with x=1.9) was then performed under the following conditions:

Total RF power: 700 W

Distance: target to surface to be coated: 70 mm

Pressure of the enclosure under vacuum: 3 Pa (0.03 mbar)

Flow rate of inert gas (Ar) : 70 standard cm³/min

The duration of the operation was varied in order to obtain two deposit thicknesses: 0.67 $\mu$m (sample 1) and 1.5 $\mu$m (sample 2).

The analysis by X-ray photoelectron spectroscopy shows that the deposit has the formula $SiO_x$ with x being close to 1.8.

The resistance of these plates was then tested with regard:

to scratching, using pencils of different lead hardnesses starting with the softest pencil 6B, going through increasing medium hardnesses B, HB, F, H, up to the hardest pencil 9H.

to saline mists (200 h) according to the French standard NF X 41002, with the plates flat or bent to 90° or to 180° after the deposition operation.

The reflectance of sample 3 of the prior art based on an alloy of the 1098 type, which was very bright rolled, and that of samples 1 and 2 based on an alloy of the 1050 type are roughly the same, while the starting alloy used according to the invention is of lesser quality.

The resistance to scratching was evaluating by noting the hardness from which one no longer notes any trace on the deposit after observation with the optical microscope at 50×.

The resistance to saline mist is noted on the flat surface and on the bending lines; a good resistance is noted by (++++), an oxidation veil leading to a grayish appearance or to dulling is noted by (+). The intermediate notations correspond to: (+++) slight alteration or irisation of the surface, (++) evident oxidation veil.

It should be noted that in the case of the invention (samples 1 and 2), the coated flat surfaces are of very good quality and that, even on the bending lines, the quality is at the same level; one does not note, in particular, any opaqueness or pitting on the edges of the ends.

With regard to sample 4, one still notes a quality that is possibly sufficient, although, among other things, the silica is by itself less effective than the oxides with x<2 for protecting a flat surface, and it has less flexibility, which can be seen in the results after bending.

Furthermore, the strips of aluminum of the bright 1050 grade, rolled on spools, were coated by continuous treatment in the process of unwinding, with an equivalent quality being obtained.

Using other samples exposed for 500 h to saline mist, equivalent results were obtained.

The invention is particularly valuable since the coated strips can then be worked in view of obtaining different articles, which in spite of this keep an excellent quality of brightness over time.

As has been seen, these strips are particularly well suited:

for the manufacture of reflectors for public or private lighting apparatuses, and for radiation heating apparatuses, or for the manufacture of decorative articles, for example, containers in the luxury products industry, among others, cosmetic products, mirrors, or ornamental strips for automobiles, etc. . . .

Thus, the articles obtained simultaneously offer:

better resistance of the desired surface appearance to corrosion, for example, the brightness [quality], especially in the surrounding environment, in workshops, warehouses . . . in spite of the deformations undergone by the coated strip during the manufacture of the article, a greatly reduced manufacturing cost because it is possible to use ordinary inexpensive aluminum alloys, and because no effluent, which must be treated, is emitted during the manufacturing process.

They are also distinguished from the preshaped articles (for example, based on aluminum), which are later coated, because they are very easy to obtain. It is in effect easier and more economical to coat a strip according to the invention, then to shape the articles, than to coat the articles once they are shaped. This advantage is accompanied by a better quality of protection and of appearance rendering (brightness and reflecting power, for example) because in the course of formation of the article, the desired surface appearance is protected by the film made according to the invention.

The strip and the articles according to the invention are also distinguished from the articles coated by complex oxide layers containing silica, for the purpose of improving the reflectance of the support. This is not the case of the present invention, in which the film is used to protect a particular surface condition of the strip before and after deformation in order to obtain corresponding articles without altering their surface appearance.

Moreover, the strip according to the invention as well as the articles produced from it are less easily soiled or capable of being dulled; in effect, they retain dust and fingerprints to a significantly lower degree. Likewise, the resistance to scratching is at least equivalent to that of the other types of coated strips, which allows them to be handled, packaged, cleaned . . . without the risk of deterioration of their appearance.

We claim:

1. A reflective strip comprising aluminum or its alloys, coated with an anticorrosion protection coating, said strip having an improved shaping capability allowing it to maintain its surface appearance and its protection intact after shaping, wherein the coating consists of a 0.1–1.5 µm thick layer of silicon oxide having a sub-stoichiometric formula $SiO_x$ where x is greater than 1.8 and less than 2.

2. A process, comprising shaping the strip of claim 1 by a conventional shaping operation, thereby forming a part.

3. A strip according to claim 1, wherein the alloys have a purity less than that of the 1085 alloy (according to the Aluminum Association).

4. A strip according to claim 1, wherein the aluminum alloys have a purity between that of the 1085 and 1199 alloys.

5. A strip according to claim 1, wherein it is coated with a polymer material on the surface opposite the surface coated with the silicon oxide layer.

6. A strip according to claim 1, wherein the surface appearance of said strip is smooth and of the reflecting type.

7. A strip according to claim 1, wherein the surface appearance of said strip is a decorative appearance.

8. A process for preparing the strip of claim 1, comprising, pickling a rolled bear strip; and depositing said layer of silicon oxide on the rolled bear strip, by PVD.

9. A process according to claim 8, wherein the pickling is chemical, electrochemical, or thermal.

10. A process according to claim 8, wherein the PVD consists of performing cathode sputtering assisted by a magnetron and in the radio-frequency mode.

11. A process according to claim 8, wherein the strip is subjected to annealing either during pickling or after deposition of the silicon oxide.

12. The process of claim 2, wherein the part is a reflector for lighting or heating apparatuses.

13. The process of claim 2, wherein the part is a decorative article for construction, automobiles or packaging.

* * * * *